(12) United States Patent
Ohashi et al.

(10) Patent No.: US 12,091,751 B2
(45) Date of Patent: Sep. 17, 2024

(54) SUBSTRATE PROCESSING APPARATUS, METHOD OF MANUFACTURING SEMICONDUCTOR DEVICE, AND RECORDING MEDIUM

(71) Applicant: KOKUSAI ELECTRIC CORPORATION, Tokyo (JP)

(72) Inventors: Naofumi Ohashi, Toyama (JP); Tomihiro Amano, Toyama (JP); Satoshi Takano, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 180 days.

(21) Appl. No.: 17/480,274

(22) Filed: Sep. 21, 2021

(65) Prior Publication Data

US 2022/0090259 A1    Mar. 24, 2022

(30) Foreign Application Priority Data

Sep. 24, 2020    (JP) ................................ 2020-159656

(51) Int. Cl.
  *C23C 16/455*    (2006.01)
  *C23C 16/34*     (2006.01)
  (Continued)

(52) U.S. Cl.
  CPC .......... *C23C 16/455* (2013.01); *C23C 16/345* (2013.01); *C23C 16/45591* (2013.01);
  (Continued)

(58) Field of Classification Search
  CPC .......... C23C 16/4412; C23C 16/45591; C23C 16/455
  See application file for complete search history.

(56) References Cited

U.S. PATENT DOCUMENTS

2001/0042514 A1*  11/2001  Mizuno ................... C23C 16/54
                                                       118/728
2004/0200412 A1*  10/2004  Frijlink ............... C23C 16/4412
                                                       118/715
(Continued)

FOREIGN PATENT DOCUMENTS

JP    2009-088473 A    4/2009
JP    2009-224775 A    10/2009
(Continued)

OTHER PUBLICATIONS

Taiwan Office Action issued on Nov. 7, 2022 for Taiwan Patent Application No. 110132729.

(Continued)

*Primary Examiner* — Joseph A Miller, Jr.
(74) *Attorney, Agent, or Firm* — Volpe Koenig

(57) ABSTRACT

A substrate processing technique includes a substrate mounting table including a substrate mounting surface for a substrate; a process container for accommodating the substrate mounting table and forming a process chamber for processing the substrate mounted on the substrate mounting surface; at least one gas supplier for suppling a processing gas to the process chamber; a first wall arranged on an outer peripheral side of the at least one substrate mounting table; a second wall arranged at an outer side of the first wall on the outer peripheral side of the substrate mounting table; at least one exhaust flow path formed between the first wall and the second wall and configured to discharge a gas in the process chamber; and a shield plate arranged below the substrate mounting table and extending at least to a lower side of a lower end of the second wall.

12 Claims, 11 Drawing Sheets

(51) Int. Cl.
    *C23C 16/458*     (2006.01)
    *C23C 16/52*     (2006.01)
    *H01L 21/02*     (2006.01)

(52) U.S. Cl.
    CPC .......... *C23C 16/4584* (2013.01); *C23C 16/52* (2013.01); *H01L 21/0217* (2013.01); *H01L 21/0228* (2013.01)

(56) References Cited

U.S. PATENT DOCUMENTS

| | | |
|---|---|---|
| 2010/0279008 A1 | 11/2010 | Takagi |
| 2010/0310772 A1 | 12/2010 | Tsuda |
| 2014/0130743 A1 | 5/2014 | Toriya et al. |
| 2017/0283945 A1 | 10/2017 | Yahata |
| 2018/0277405 A1 | 9/2018 | Shimamoto et al. |
| 2019/0295864 A1 | 9/2019 | Itonaga et al. |
| 2019/0385873 A1 | 12/2019 | Yamagishi et al. |

FOREIGN PATENT DOCUMENTS

| | | |
|---|---|---|
| JP | 2017-183393 A | 10/2017 |
| JP | 2019-169537 A | 10/2019 |
| KR | 10-2014-0063413 A | 5/2014 |
| KR | 10-2019-0142211 A | 12/2019 |

OTHER PUBLICATIONS

Korean Office Action issued on Nov. 16, 2023 for Korean Patent Application No. 10-2021-0125161.

* cited by examiner

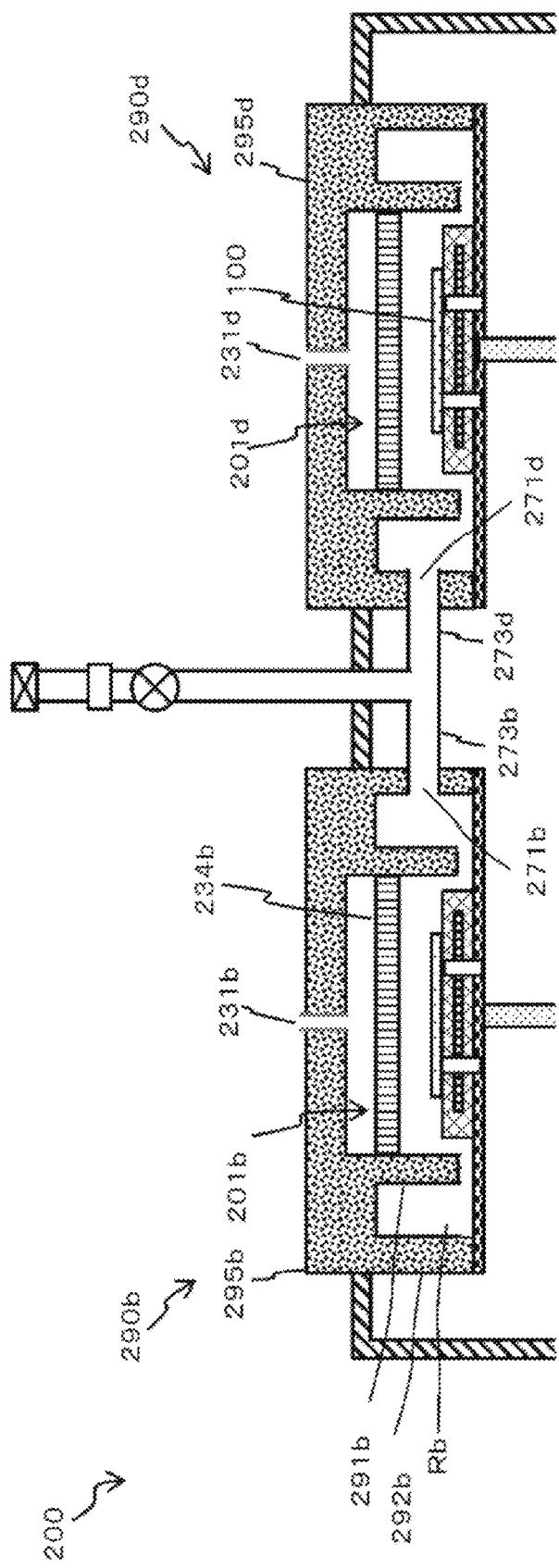

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2020-159656, filed on Sep. 24, 2020, the entire contents of which are incorporated herein by reference.

TECHNICAL FIELD

The present disclosure relates to a substrate processing apparatus, a method of manufacturing a semiconductor device, and a recording medium.

BACKGROUND

In the related art, as a form of a substrate processing apparatus used in a semiconductor device manufacturing process, there is known, for example, an apparatus that includes a process chamber configured to process a substrate and a transfer chamber adjacent to the process chamber.

With the substrate processing apparatus having such a configuration, in the substrate processing process, a gas in the process chamber may flow into the transfer chamber, and the gas in the transfer chamber may flow into the process chamber.

SUMMARY

Some embodiments of the present disclosure provide a technique capable of suppressing a gas in a process chamber from flowing into a transfer chamber and suppressing a gas in the transfer chamber from flowing into the process chamber in a substrate processing process.

According to embodiments of the present disclosure, there is provided a technique that includes: at least one substrate mounting table including a substrate mounting surface on which a substrate is mounted; a process container configured to accommodate the at least one substrate mounting table and form a process chamber configured to process the substrate mounted on the substrate mounting surface; at least one gas supplier configured to supply a processing gas to the process chamber; a first wall arranged on an outer peripheral side of the at least one substrate mounting table; a second wall arranged at an outer side of the first wall on the outer peripheral side of the at least one substrate mounting table; at least one exhaust flow path formed between the first wall and the second wall and configured to discharge a gas in the process chamber; and a shield plate arranged below the at least one substrate mounting table and configured to extend at least to a lower side of a lower end of the second wall.

BRIEF DESCRIPTION OF DRAWINGS

The accompanying drawings, which are incorporated in and constitute a part of the specification, illustrate embodiments of the present disclosure.

FIG. 10 is a schematic cross-sectional view of a main part of a substrate processing apparatus according to other embodiments of the present disclosure.

DETAILED DESCRIPTION

Figure 1:
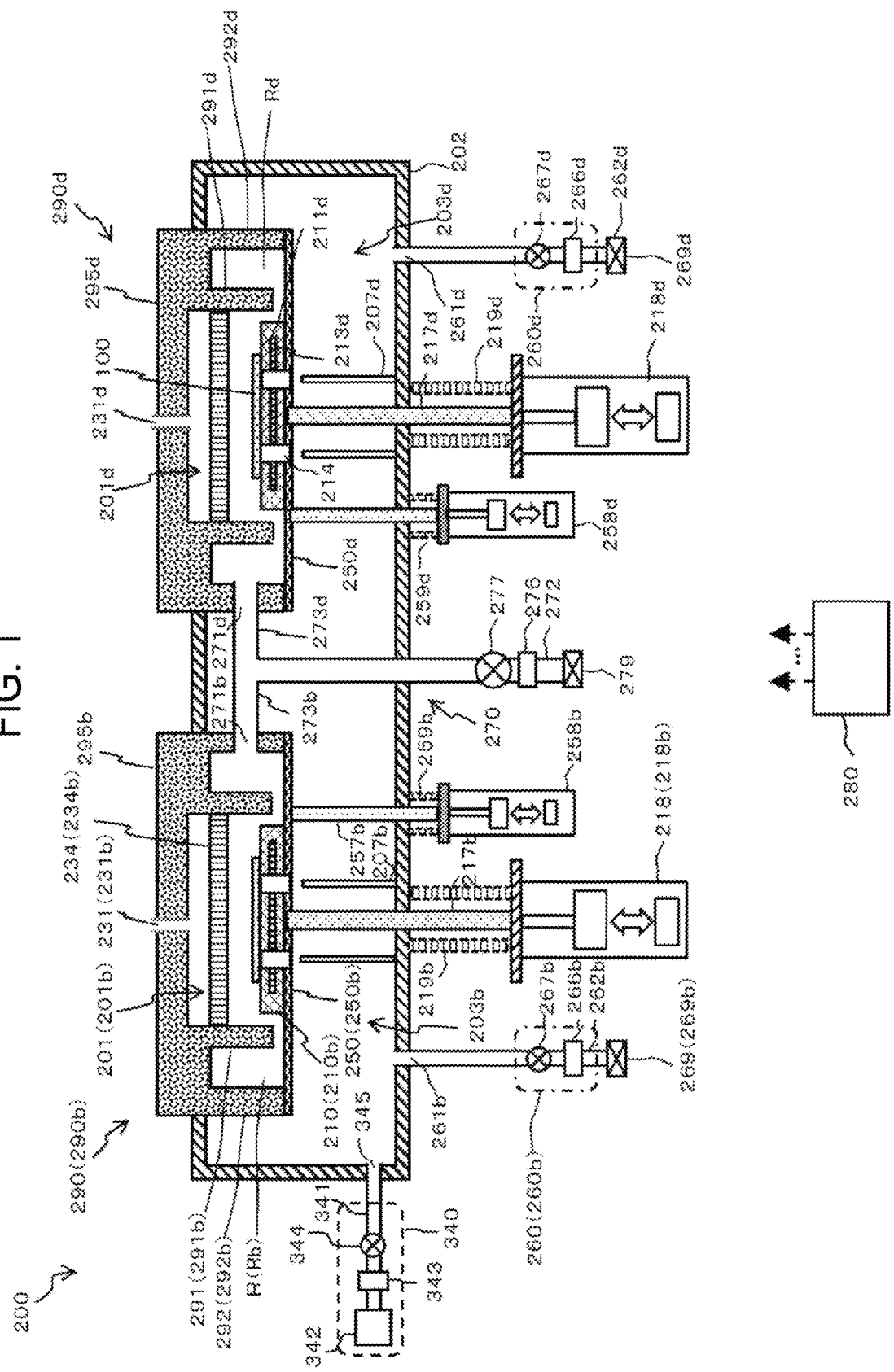
FIG. 1 is a schematic cross-sectional view of a main part of a substrate processing apparatus according to embodiments of the present disclosure.

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Embodiments of the Present Disclosure

Embodiments of the present disclosure will be described below.

(1) Configuration of Substrate Processing Apparatus

First, a configuration of a substrate processing apparatus 200 according to embodiments of the present disclosure will be described with reference to FIGS. 1 and 3 to 8. The substrate processing apparatus 200 according to the embodiments is used in a semiconductor device manufacturing process, and is configured as an apparatus that processes a plurality of substrates to be processed. Examples of the substrate to be processed include a semiconductor wafer substrate (hereinafter, simply referred to as "wafer") in which semiconductor devices are built. The drawings used in the following description are all schematic. Dimensional relationships among the respective components, ratios among the respective components, and the like shown in the drawings may not have to match actual ones. Further, dimensional relationships among the respective components, ratios among the respective components, and the like may not have to match one another even among the drawings.

(Process Container)

As shown in FIG. 1, the substrate processing apparatus 200 includes a process container 202. The process container 202 has, for example, an angular cross section and is configured as a flat sealed container. The process container 202 is made of a metal material such as aluminum (Al) or stainless steel (SUS). A process chamber 201 configured to process a wafer 100 such as a silicon wafer, and a transfer chamber 203 where the wafer 100 passes when the wafer 100 is transferred to the process chamber 201 are formed in the process container 202.

Figure 5:
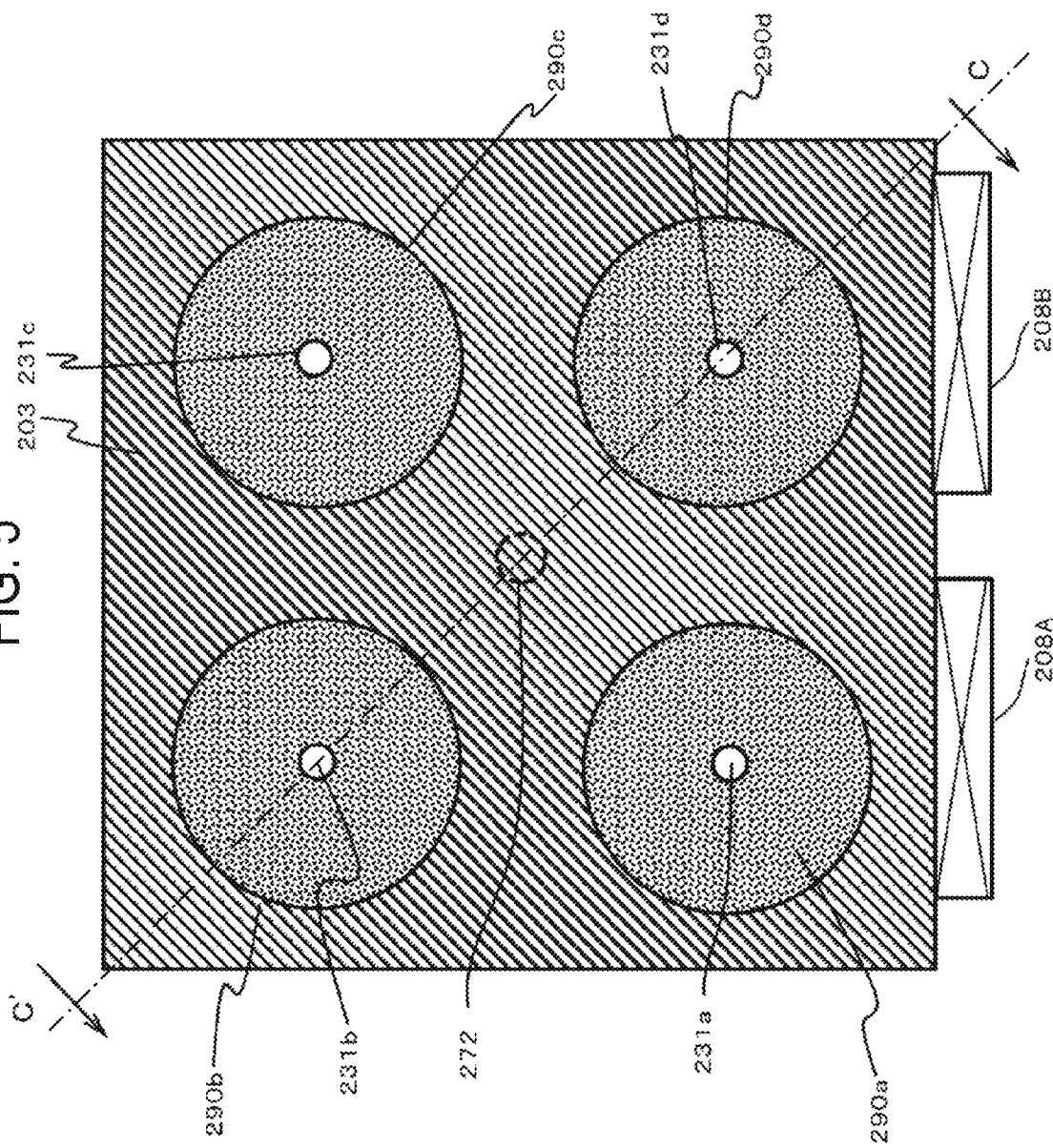
FIG. 5 is a schematic plane view of a main part of a substrate processing apparatus according to embodiments of the present disclosure.

For example, four circular openings (not shown) are formed at the upper surface of the process container 202, and lid-like structures 290 (290a, 290b, 290c and 290d) are attached to penetrate these openings, respectively. As shown in FIG. 5, the lid-like structures 290a to 290d are circumferentially arranged around a common exhaust pipe 272 to be described below. FIG. 5 is a view of the substrate processing apparatus 200 as viewed from above. The vertical cross-sectional view taken along a line C-C' in FIG. 5 corresponds to FIG. 1.

As shown in FIG. 1, the lid-like structure 290 includes lids 295 (295a, 295b, 295c or 295d) that fits into the opening, a second wall 292 (292a, 292b, 292c or 292d) extending downward from an edge of the lid 295 and forming an outer peripheral wall of the lid-like structure 290, and a first wall 291 (291a, 291b, 291c or 291d) arranged inside the second wall 292 and forming the inner peripheral wall of the lid-like structure 290. The second wall 292 is configured to further extend downward than the first wall 291.

Exhaust flow paths R (Ra, Rb, Rc and Rd) are formed between the first walls 291a to 291d and the second walls 292a to 292d, respectively, over the entire circumference. The process chambers 201 (201a, 201b, 201c and 201d) are formed by a space configured by the first wall 291 and the lid 295 of the lid-like structure 290.

The transfer chambers 203 (203a, 203b, 203c and 203d) are installed below the process chambers 201 to correspond to the respective process chambers 201a, 201b, 201c and 201d. For example, the transfer chamber 203a corresponds to the process chamber 201a, the transfer chamber 203b corresponds to the process chamber 201b, the transfer chamber 203c corresponds to the process chamber 201c, and the transfer chamber 203d corresponds to the process chamber 201d.

Figure 3:
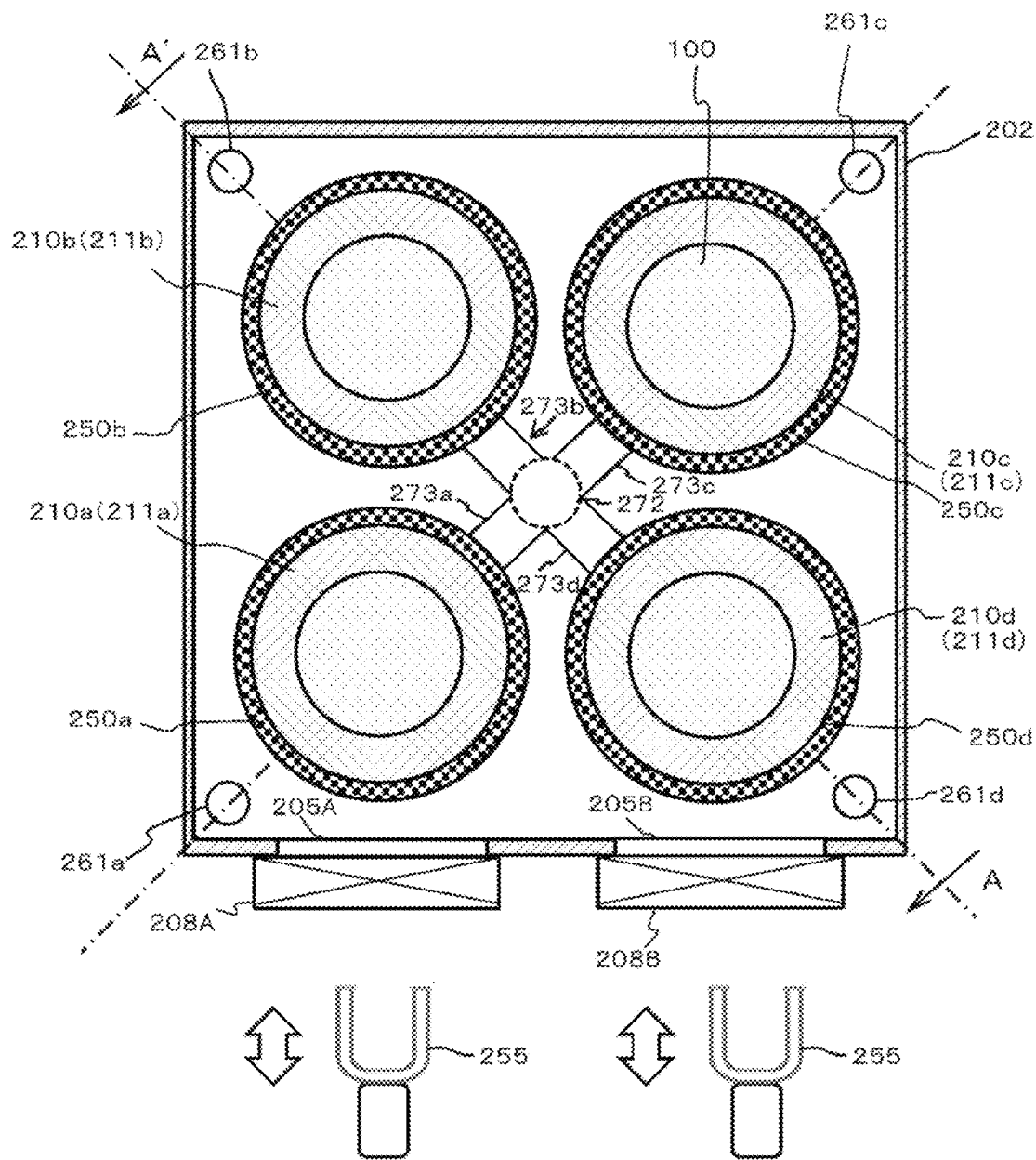
FIG. 3 is a schematic plane view of a main part of a substrate processing apparatus according to embodiments of the present disclosure.

A substrate loading port 205A adjacent to a gate valve 208A and a substrate unloading port 205B adjacent to a gate valve 208B are respectively installed on a lower side surface of the process container 202. The wafer 100 is moved between the transfer chamber (not shown) and the transfer chamber 203 via the substrate loading port 205A and the substrate unloading port 205B (see FIG. 3). FIG. 3 is a view of the vicinity of the below-described first exhaust pipe 273 as viewed from above. For the sake of convenience, the lid-like structure 290 and the below-described rotation arm (hereinafter sometimes abbreviated as "arm") 222, and the like are not shown in FIG. 3. The vertical cross-sectional view taken along a line A-A' in FIG. 3 corresponds to FIG. 1. A plurality of lift pins 207 (207a, 207b, 207c, and 207d) are respectively installed at the positions corresponding to the transfer chambers 203a to 203d on the bottom of the process container 202.

Figure 4:
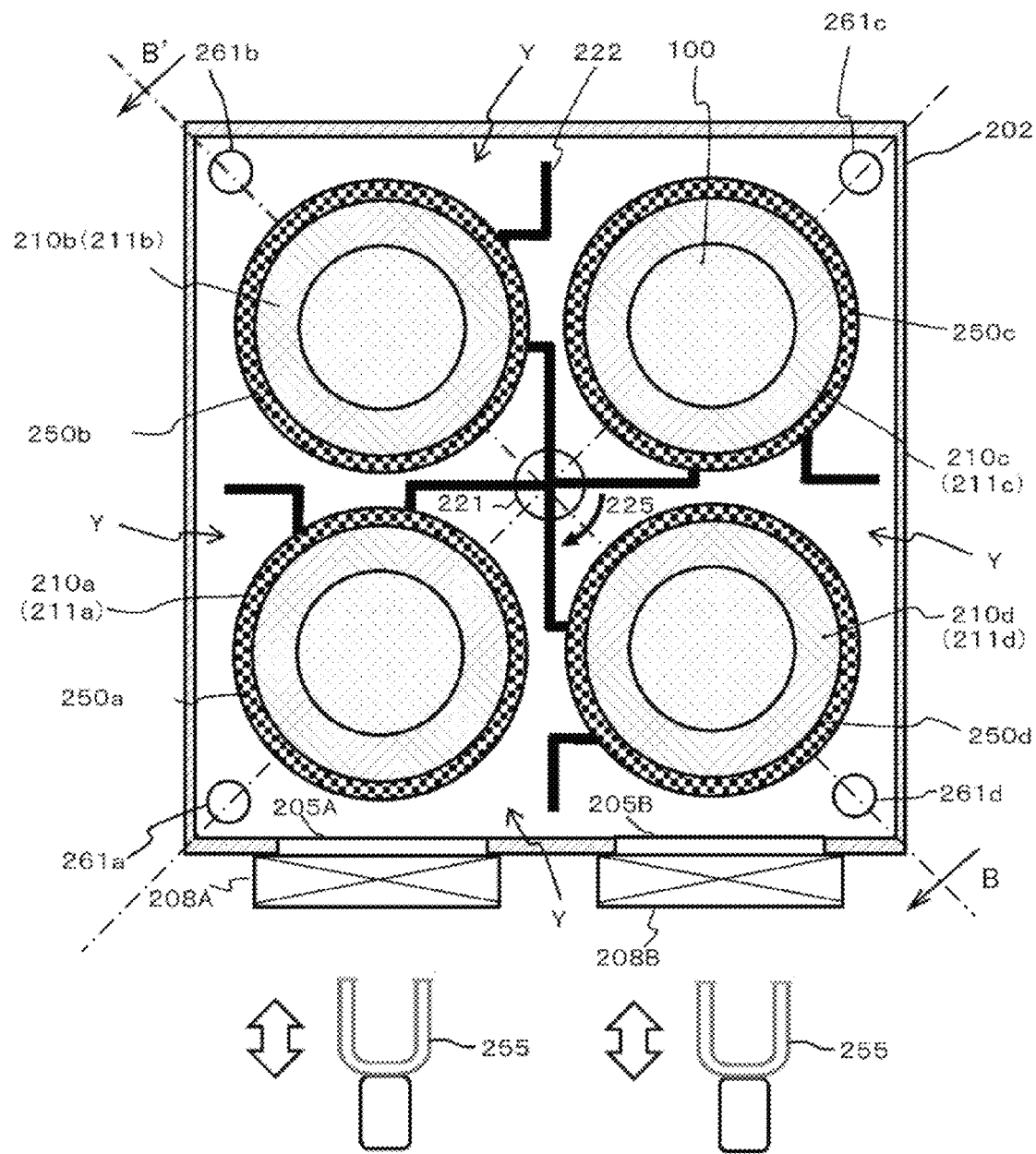
FIG. 4 is a schematic plane view of a main part of a substrate processing apparatus according to embodiments of the present disclosure.

Substrate mounting tables 210 (210a, 210b, 210c and 210d) configured to mount the wafers 100 thereon are installed in the process chambers 201a to 201d, respectively (see FIGS. 1 and 4). FIG. 4 is a view of the vicinity of the below-described arm 222 as viewed from above. For the sake of convenience, the lid-like structure 290, the below-described first exhauster 270, and the like are not shown in FIG. 4. The vertical cross-sectional view taken along a line B-B' in FIG. 4 corresponds to FIG. 1.

The substrate mounting tables 210a to 210d include substrate mounting surfaces 211 (211a, 211b, 211c, and 211d) on which the wafers 100 are mounted, and heaters 213 (213a, 213b, 213c, and 213d) as heating sources, respectively. In the substrate mounting table 210, through-holes 214 through which the lift pins 207 pass are provided at the positions corresponding to the lift pins 207 respectively.

The substrate mounting tables 210 are supported by shafts 217 (217a, 217b, 217c, and 217d). The shaft 217 penetrates the bottom of the process container 202 and is connected to a shield outside the process container 202. As the substrate mounting table elevating part 218 is operated to raise or lower the shaft 217 and the substrate mounting table 210, the substrate mounting table 210 may raise or lower the wafer 100 mounted on the substrate mounting surface 211. The shaft 217 is insulated from the process container 202. Further, a periphery of a lower end of the shaft 217 is covered with a bellows 219, whereby an inside of the process chamber 201 is kept airtight. An operation of the substrate mounting table 210 will be described below.

Figure 6:
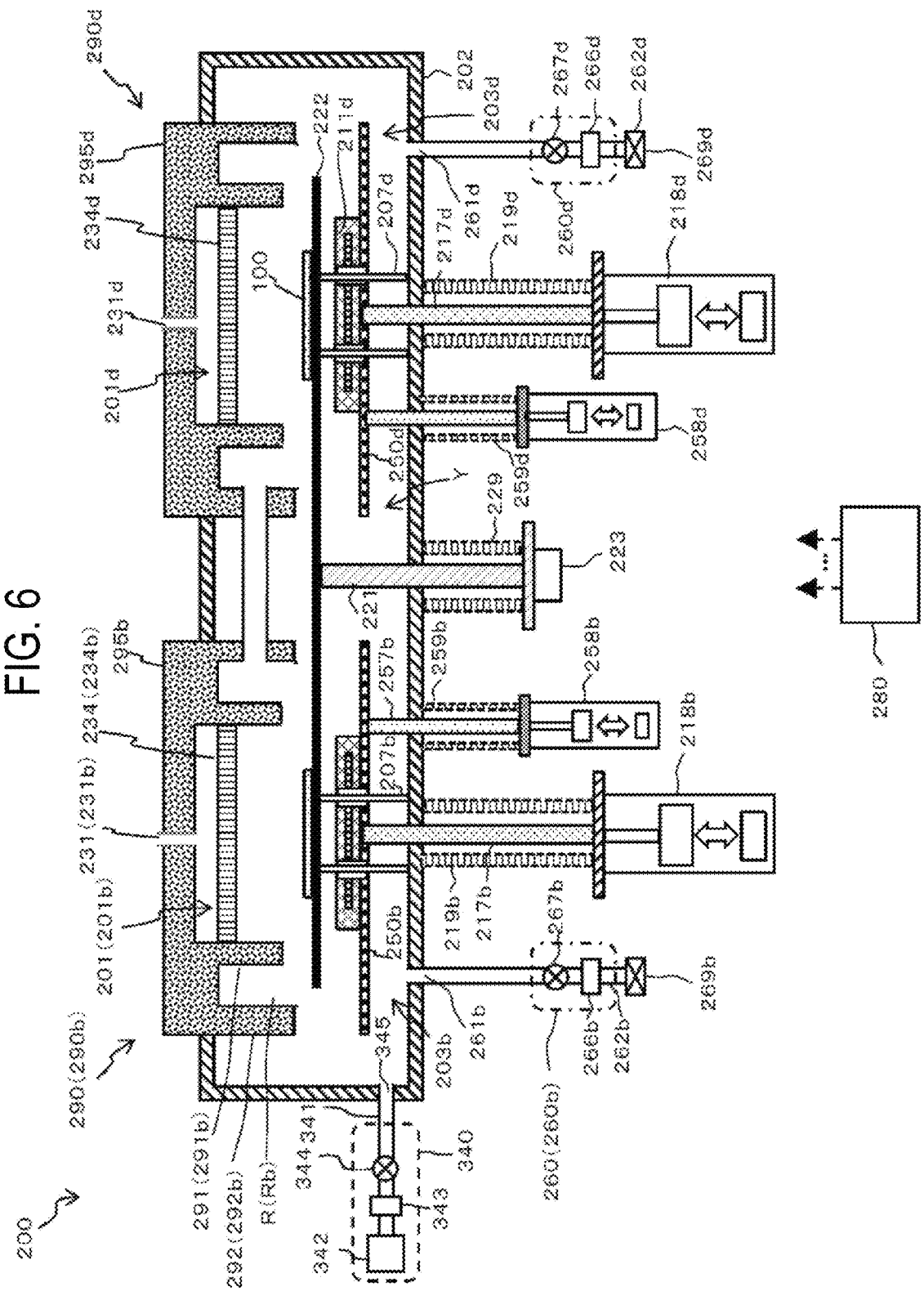
FIG. 6 is a schematic cross-sectional view of a main part of a substrate processing apparatus according to embodiments of the present disclosure.

When the wafer 100 is transferred, the substrate mounting table 210 is lowered until the substrate mounting surface 211 faces the substrate loading port 205A and the substrate unloading port 205B (see FIG. 6). When the wafer 100 is processed, the substrate mounting table 210 is raised until the wafer 100 reaches a processing position in the process chamber 201, as shown in FIG. 1. A robot arm 255 is arranged outside the process container 202 and has a function of transferring the wafer 100 to the inside or the outside of the process container 202.

Below the substrate mounting table 210, shield plates 250 (250a, 250b, 250c, and 250d) formed of disc-like plate-shaped members corresponding to the second walls 292a to 292d are arranged to extend to the lower sides of the lower ends of the second walls 292a to 292d respectively. A distance between the shield plates 250a to 250d and the lower ends of the first walls 291a to 291d is set to be larger than a distance between the shield plates 250a to 250d and the lower ends of the second walls 292a to 292d.

The shield plates 250 are supported by shafts 257 (257a, 257b, 257c and 257d). The shaft 257 penetrates the bottom of the process container 202 and is connected to the shield plate elevating part 258 outside the process container 202. The shaft 257 is insulated from the process container 202. Further, the peripheries of the lower ends of the shafts 257a to 257d are covered with bellows 259 (259a, 259b, 259c and 259d), whereby the inside of the process chamber 201 is kept airtight. An operation of the shield plate 250 will be described below.

The substrate mounting table elevating part 218 and the shield plate elevating part 258 are respectively configured to be capable of being raised or lowered independently.

Shower heads 234 (234a, 234b, 234c, and 234d) as gas distributors are installed at the process chambers 201 at the positions facing the substrate mounting surfaces 211a to 211d, respectively.

As shown in FIG. 5, the lid-like structures 290a to 290d are provided with gas introduction holes 231 (231a, 231b, 231c and 231d), respectively. The gas introduction holes 231a to 231d are in fluid communication with the below-described common gas supply pipe 301. The vertical cross-sectional view taken along a line A-A' in FIG. 5 corresponds to FIG. 1.

As shown in FIG. 4, the substrate mounting tables 210a to 210d are circumferentially arranged around a rotary shaft 221. An arm 222 configured to support the lower surface of the wafer 100 mounted on the substrate mounting surface (for example, the substrate mounting surface 211a) and transfer the wafer 100 to the adjacent substrate mounting surface (for example, the substrate mounting surface 211b) is installed at the rotary shaft 221. In the embodiments, four arms 222 are installed at the rotary shaft 221.

As shown in FIG. 4, the arm 222 is formed such that a linear rod member including a plurality of corner portions and is continuous in a plane view. The wafer 100 may be supported by the vicinity of the plurality of corner portions.

The rotary shaft 221 penetrates the bottom of the process container 202 and is connected to an arm elevating/rotating part (hereinafter, sometimes abbreviated as "arm elevating part") 223 outside the process container 202. The rotary shaft 221 is insulated from the process container 202. Further, the periphery of the lower end of the rotary shaft 221 is covered with a bellows 229, whereby the inside of the process chamber 201 is kept airtight. The arm elevating/rotating part 223 raises or lowers and rotates the arm 222 by raising or lowering and rotating the rotary shaft 221. The rotation direction is, for example, a direction (clockwise direction) indicated by an arrow 225 in FIG. 4.

In the embodiments, the component including the function of raising or lowering the arm 222 and the function of rotating the arm 222 is called the arm elevating/rotating part. However, the component may be configured to include any of the functions independently. In that case, the component is called an arm rotating part or an arm elevating part. Further, in the case where the component is configured to include both or either of the functions, it is also called an arm controller. An operation of the arm 222 will be described below in detail.

(Exhauster)

The first exhauster 270 configured to exhaust the atmosphere in the process chambers 201a to 201d to the outside of the process container 202 will be described with reference to FIGS. 1 and 3.

Exhaust holes 271 (271a, 271b, 271c, and 271d) are provided at the second walls 292a to 292d of the lid-like structures 290a to 290d, respectively. The first exhauster 270 includes first exhaust pipes 273 (273a, 273b, 273c, and 273d) which are in fluid communicating with the exhaust holes 271a to 271d and a common exhaust pipe 272 configured to join gases flowing through the first exhaust pipes 273a to 273d.

An APC (Auto Pressure Controller) 276 is installed at the common exhaust pipe 272. The APC 276 includes a valve body (not shown) whose opening state may be regulated, and regulates conductances of the first exhaust pipes 273a to 273d in response to an instruction from the controller 280. Further, a valve 277 is installed at the common exhaust pipe 272 on the upstream side of the APC 276. The first exhaust pipes 273a to 273d, the common exhaust pipe 272, the valve 277 and the APC 276 are collectively referred to as the first exhauster 270.

In the embodiments, for example, the common exhaust pipe 272 is configured to penetrate the bottom of the process container 202 downward from a position where distances from the exhaust holes 271a to 271d in the first exhaust pipes 273a to 273d are equal.

A DP (Dry Pump) 279 is installed at the downstream side of the common exhaust pipe 272. The DP 279 exhausts the atmosphere in the process chambers 201a to 201d via the first exhaust pipes 273a to 273d and the common exhaust pipe 272.

The second exhausters 260 (260a, 260b, 260c and 260d) configured to exhaust the atmosphere in the transfer chambers 203a to 203d will be described with reference to FIGS. 1 and 3.

Exhaust holes 261 (261a, 261b, 261c, and 261d) are installed at the bottom of the process container 202 to correspond to the transfer chambers 203 (203a to 203d). The second exhausters 260a to 260d include second exhaust pipes 262 (262a, 262b, 262c, and 262d) which are in fluid communication with the exhaust holes 261a to 261d.

APCs 266 (266a, 266b, 266c and 266d) are installed at the second exhaust pipes 262a to 262d. The APCs 266a to 266d include valve bodies (not shown) whose opening states may be regulated, and regulate conductances of the second exhaust pipes 262a to 262d in response to an instruction from the controller 280. Further, valves 267 (267a, 267b, 267c, and 267d) are installed at the second exhaust pipes 262a to 262d on the upstream side of the APCs 266a to 266d, respectively. The second exhaust pipes 262a to 262d, the valves 267a to 267d, and the APCs 266a to 266d are collectively referred to as second exhausters 260 (260a, 260b, 260c, and 260d).

DPs 269 (269a, 269b, 269c, and 269d) are installed at the downstream side of the second exhaust pipe 262. The DP 269 exhausts the atmosphere in the transfer chamber 203 via the second exhaust pipe 262. In the embodiments, the DP 269 is installed at each second exhauster 260. However, the present disclosure is not limited thereto. The DP 269 may be common to the respective exhausters.

(Gas Supply System)

Figure 7:
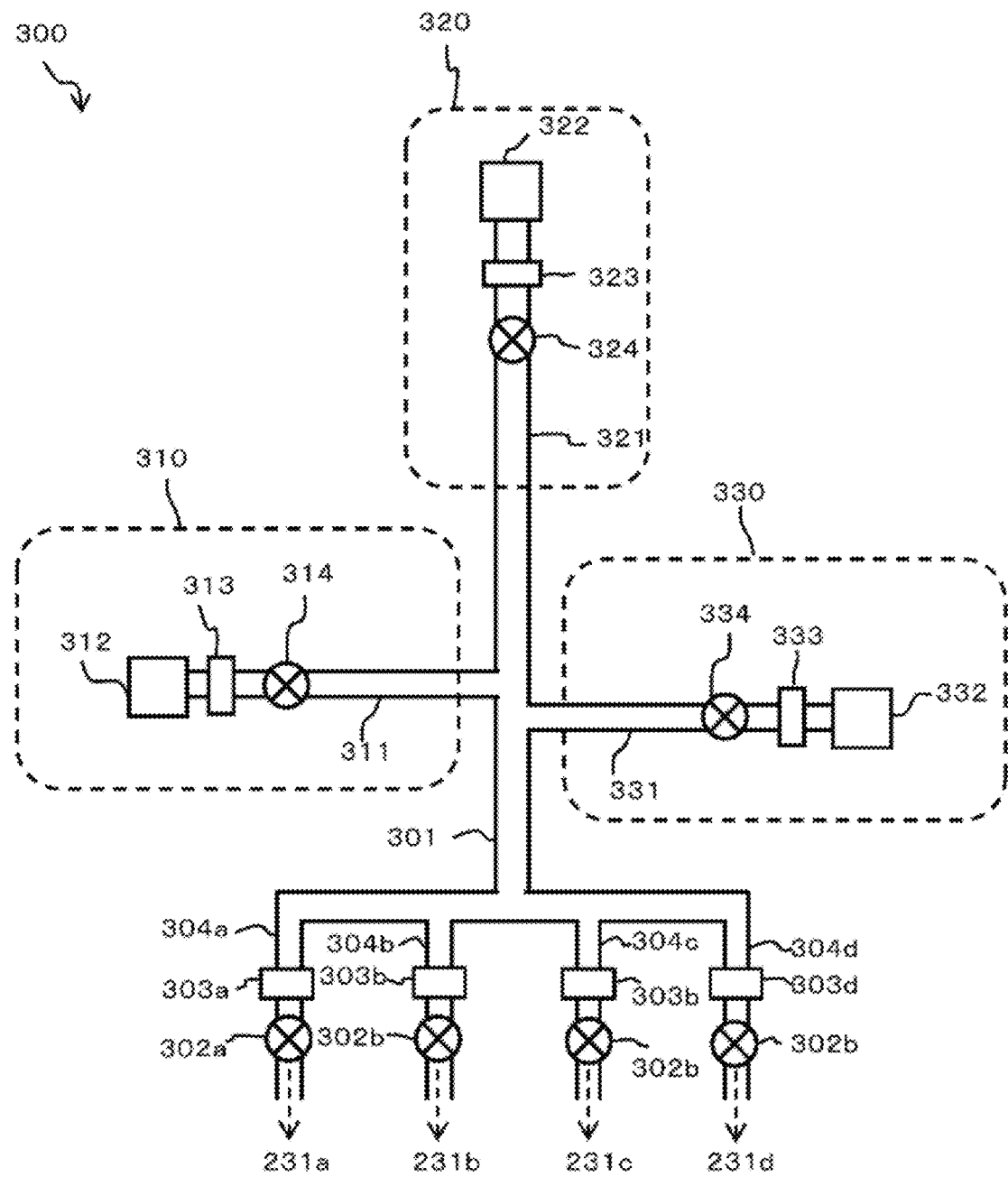
FIG. 7 is a diagram illustrating a gas supplier in a substrate processing apparatus according to embodiments of the present disclosure.

The first gas supply system 300 configured to supply gases into the process chambers 201a to 201d will be described with reference to FIG. 7.

The lids 295a to 295d of the lid-like structures 290a to 290d are provided with gas introduction holes 231a, 231b, 231c, and 231d, respectively. The lids 295a to 295d are connected to a common gas supply pipe 301 via distribution pipes 304 (304a, 304b, 304c and 304d) such that the gas introduction holes 231a to 231d and the common gas supply pipe 301 are in fluid communication with each other. Mass flow controllers (MFCs) 303 (303a, 303b, 303c and 303d), which are flow rate controllers (flow rate control parts), and valves 302 (302a, 302b, 302c and 302d) are installed at the distribution pipes 304 sequentially from the upstream side. An amount of the gas supplied to the respective process chambers 201a to 201d is regulated by using the valves 302a to 302d and the MFCs 303a to 303d. A first gas supply pipe 311, a second gas supply pipe 321 and a third gas supply pipe 331 are connected to the common gas supply pipe 301.

A first gas supply source 312, an MFC 313, and a valve 314, which is an opening/closing valve, are installed at the first gas supply pipe 311 sequentially from the upstream side.

From the first gas supply source 312, for example, a silicon (Si)-containing gas which is a main element constituting a film is supplied. The Si-containing gas is a precursor gas. As the Si-containing gas, it may be possible to use, for example, a chlorosilane-based gas such as a monochlorosilane ($SiH_3Cl$) gas, a dichlorosilane ($SiH_2Cl_2$) gas, a trichlorosilane ($SiHCl_3$) gas, a hexachlorodisilane ($Si_2Cl_6$, abbreviation: HCDS) gas or the like.

A first gas supplier 310 (also referred to as Si-containing gas supplier) mainly includes the first gas supply pipe 311, the MFC 313, and the valve 314.

A second gas supply source 322, an MFC 323, and a valve 324 are installed at the second gas supply pipe 321 sequentially from the upstream side.

From the second gas supply source 322, for example, a nitrogen (N)- and hydrogen (H)-containing gas, i.e., a hydrogen nitride-based gas is supplied. The N- and H-containing gas is a reaction gas. As the N- and H-containing gas, it may be possible to use, for example, an ammonia ($NH_3$) gas, a diazene ($N_2H_2$) gas, a hydrazine ($N_2H_4$) gas, or a $N_3H_8$ gas.

A second gas supplier 320 (also referred to as reaction gas supplier) mainly includes the second gas supply pipe 321, the MFC 323, and the valve 324.

A third gas supply source 332, an MFC 333, and a valve 334 are installed at the third gas supply pipe 331 sequentially from the upstream side.

An inert gas is supplied from the third gas supply source 332. The inert gas supplied from the third gas supply source 332 acts as a purge gas that purges the gas remaining in the process chamber 201 in a substrate processing process.

A third gas supplier 330 (also referred to as first inert gas supplier) mainly includes the third gas supply pipe 331, the MFC 333, and the valve 334.

Any one of the first gas supplier 310, the second gas supplier 320, and the third gas supplier 330, or a combination thereof, is referred to as first gas supply system 300.

(Second Gas Supply System)

A fourth gas supplier 340 as a second inert gas supplier configured to supply an inert gas into the transfer chambers 203a to 203d will be described with reference to FIG. 1

A fourth gas supply source 342, an MFC 343, and a valve 344 are installed at a fourth gas supply pipe 341 which is in fluid communication with the gas introduction hole 345 provided at the process container 202 sequentially from the upstream side.

An inert gas is supplied from the fourth gas supply source 342. The inert gas supplied from the fourth gas supply source 342 is supplied into the transfer chambers 203a to 203d during the substrate processing process.

A fourth gas supplier 340 (also referred to as second inert gas supplier) mainly includes the fourth gas supply pipe 341, the MFC 343 and the valve 344.

(Controller)

Figure 8:
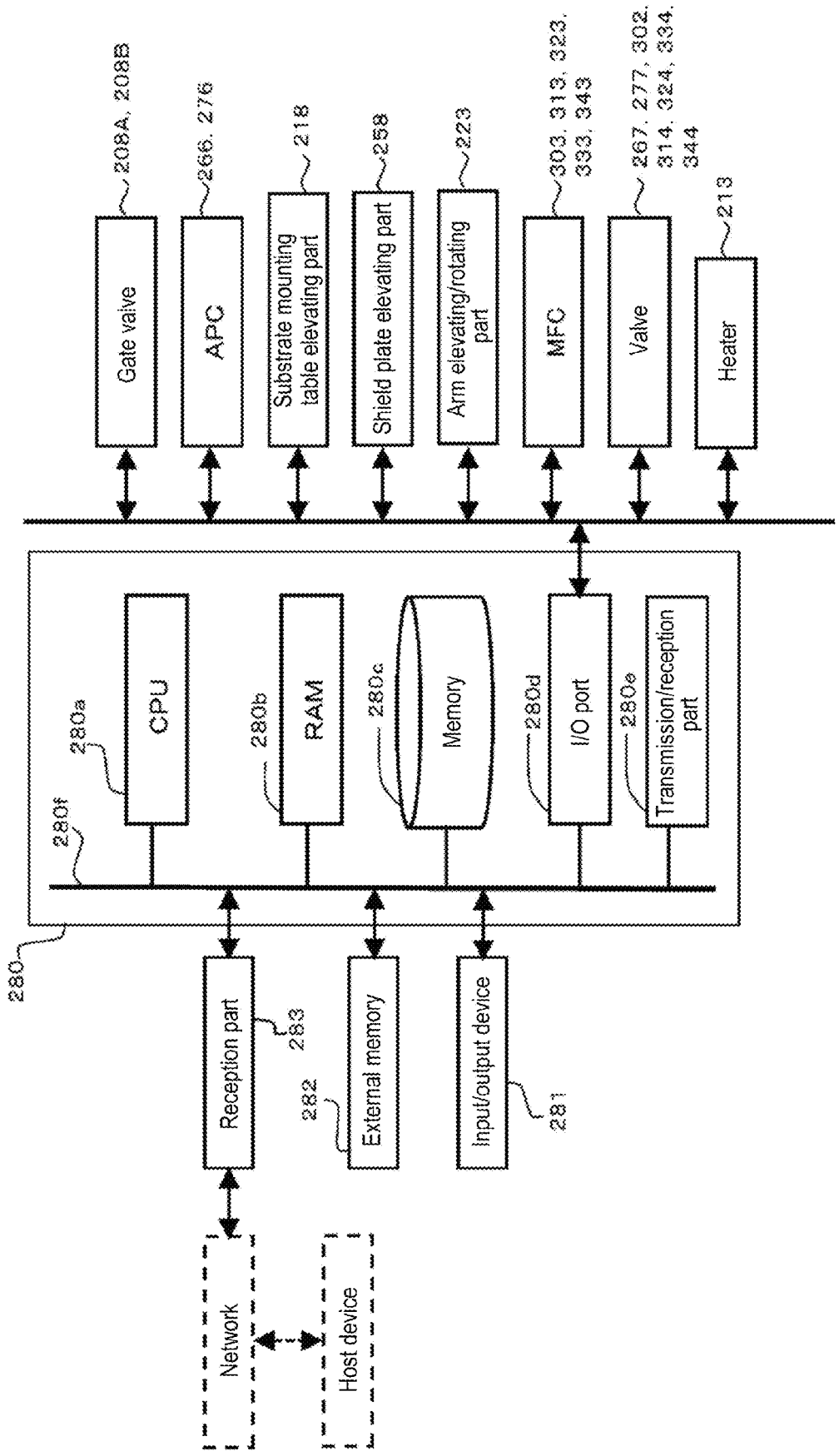
FIG. 8 is a schematic configuration diagram of a controller in a substrate processing apparatus according to embodiments of the present disclosure, in which a control system of the controller is shown in a block diagram.

The substrate processing apparatus 200 includes a controller 280 configured to control operations of the respective parts of the substrate processing apparatus 200. As shown in FIG. 8, the controller 280 is configured as a computer including a CPU (Central Processing Unit) 280a, a RAM (Random Access Memory) 280b, a memory 280c, an I/O port 280d, and a transmission/reception part 280e. The RAM 280b, the memory 280c, and the I/O port 280d are configured to be capable of exchanging data with the CPU 280a via an internal bus 280f. The transmission and reception of data in the substrate processing apparatus 200 is performed according to the instruction of the transmission/reception part 280e.

The controller 280 is configured such that an input/output device 281 configured as, for example, a touch panel or the like, or an external memory 282 may be connected to the controller 280. Further, there is provided a reception part 283 connected to a host device via a network. The reception part 283 can receive information on another apparatus from the host device.

The memory 280c includes, for example, a flash memory, a hard disk drive (HDD), a solid state drive (SSD), or the like. The memory 280c readably stores a control program that controls the operation of the substrate processing apparatus 200, a program recipe in which sequences, conditions, and the like of substrate processing to be described below are written, and the like. A process recipe functions as a program configured to be capable of causing the controller 280 to execute each sequence in the substrate processing process to be described below, to obtain a predetermined result. Hereinafter, the program recipe, the control program, and the like are collectively and simply referred to as program. When the term "program" is used herein, it may indicate a case of including the program recipe solely, a case of including the control program solely, or a case of including both the recipe and the control program. Further, the RAM 280b is configured as a memory area (work area) in which programs, data and the like read by the CPU 280a are temporarily stored.

The I/O port 280d is connected to the respective configurations of the substrate processing apparatus 200, such as the gate valves 208A and 208B, the substrate mounting table elevating part 218, the shield plate elevating part 258, the arm elevating/rotating part 223 and the like.

The CPU 280a is configured to read a control program from the memory 280c and execute the control program. The CPU 280a is configured to read a process recipe from the memory 280c in response to an input of an operation command from the input/output device 281 or the like. The CPU 280a is configured to be capable of controlling, according to the contents of the read process recipe, the opening/closing operations of the gate valves 208A and 208B, the operation of the substrate mounting table elevating part 218, the operation of the shield plate elevating part 258, the operation of the arm elevating/rotating part 223, and the like.

The controller 280 is not limited to being configured as a dedicated computer, and may be configured as a general-purpose computer. For example, the controller 280 according to the embodiments of the present disclosure may be configured by providing an external memory (for example, a magnetic tape, a magnetic disk such as a flexible disk, a hard disk, or the like, an optical disk such as a CD, a DVD or the like, a magneto-optical disk such as an MO or the like, a semiconductor memory such as a USB memory, a memory card or the like) 282 that stores the above-mentioned program, and installing the program on a general-purpose computer by using the external memory 282. The means to supply the program to the computer is not limited to the case of supplying the program via the external memory 282. For example, a communication means such as the Internet or a dedicated line may be used to supply the program without using the external memory 282. The memory 280c or the external memory 282 is configured as a computer-readable recording medium. Hereinafter, these are collectively and simply referred to as recording medium. When the term "recording medium" is used herein, it may indicate a case of including the memory 280c solely, a case of including the external memory 282 solely, or a case of including both the memory 280c and the external memory 282.

(2) Substrate Processing Process

Next, as a process of manufacturing a semiconductor device, a substrate processing process of forming an insulating film on the wafer 100 by using the substrate processing apparatus 200 including the above-described configuration will be taken as an example, and the outline thereof will be described. For example, a case where a silicon nitride (SiN) film as a nitride film is formed as an insulating film will be taken as an example. In the following description, the operation of each part is controlled by the controller 280.

(Setting Step)

At the time of substrate processing, first, a setting step is performed on the controller 280. In the setting step, process information applied to the wafer 100 to be processed is set. The setting of the process information is performed, for example, by allowing the CPU 280a to select one of the process information recorded in the memory 280c in response to the input of an operation command from the input/output device 281, reading the selected process information into the RAM 280b, and setting an operation setting value in each part via the I/O port 280d.

(Substrate Loading/Heating Step)

Figure 2:
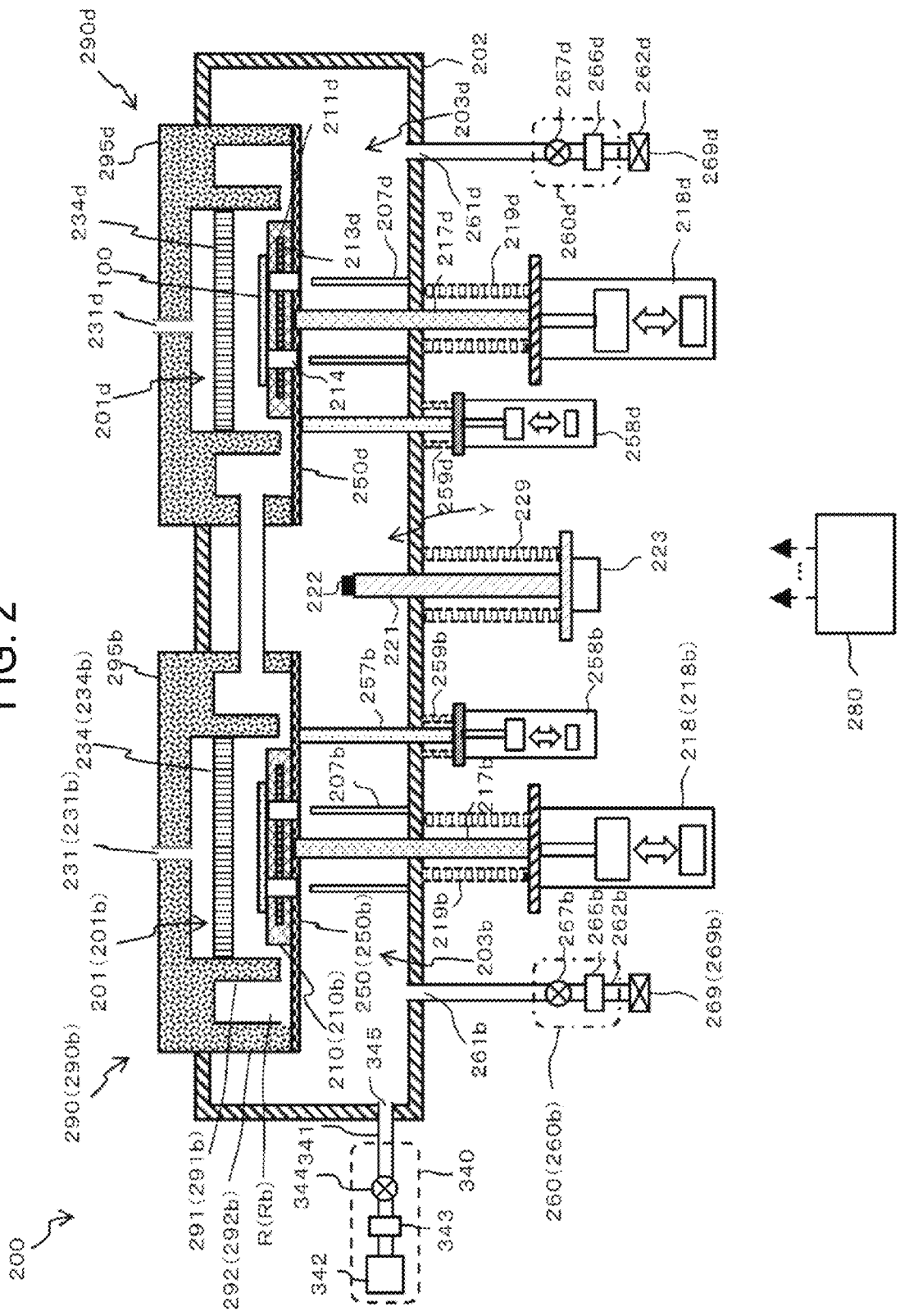
FIG. 2 is a schematic cross-sectional view of a main part of a substrate processing apparatus according to embodiments of the present disclosure.

In a substrate loading/heating step, the wafer 100 is loaded into the process container 202. Specifically, the substrate mounting table 210 is lowered by the substrate mounting table elevating part 218 such that the lift pins 207 protrude from the through-holes 214 to an upper surface side of the substrate mounting table 210. The gate valve 208A is opened, and the wafer 100 is placed on the lift pins 207a by the robot arm 255. Thereafter, the arm 222 retracted into a retraction space Y is raised by the arm elevating/rotating part 223, and the arm 222 is rotated by, for example, 45 degrees in clockwise to be located below the wafer 100. Thereafter, the arm 222 is raised to transfer the wafer 100 onto the arm 222, and then the arm 222 is rotated by, for example, 90 degrees in clockwise to transfer the wafer 100 to the adjacent transfer chamber 203b. Thereafter, the arm 222 is lowered to place the wafer 100 on the lift pins 207b. The above operation is performed four times to place the four wafers 100 on the lift pins 207a to 207d, respectively (see FIG. 6). Thereafter, the gate valve 208A is closed, the arm 222 is rotated by, for example, 45 degrees in clockwise, and then lowered to the retraction space Y. By lowering the arm 222, the wafers 100 mounted on the lift pins 207a to 207d are mounted on the substrate mounting surfaces 211a to 211d respectively (see FIGS. 2 and 4). Thereafter, the substrate mounting table 210 is raised by the substrate mounting table elevating part 218, and the wafer 100 is arranged at the wafer processing position in the process chamber 201. In the substrate loading step, the shield plate 250 is operated by the shield plate elevating part 258 in the same manner as the substrate mounting table 210. In this state, the exhauster is controlled such that an internal pressure of the process chamber 201 and an internal pressure of the transfer chamber 203 become a predetermined pressure, and the heater 213 is controlled such that a surface temperature of the wafer 100 becomes a predetermined temperature.

(Substrate Processing Step)

When a temperature of the wafer 100 located at the wafer processing position reaches a predetermined temperature, a substrate processing step is subsequently performed. In the substrate processing step, the first gas supplier 310 is controlled to supply a chlorosilane-based gas to the process chamber 201 in a state in which the wafer 100 is heated to a predetermined temperature according to the process recipe of the process information set in the setting step, and the exhauster is controlled to evacuate the process chamber 201, whereby the wafer 100 is processed. At this time, the second gas supplier 320 may be controlled such that a CVD process is performed by allowing the hydrogen nitride-based gas and the chlorosilane-based gas to exist at the same time in the process chamber 201, or a cyclic process is performed by alternately supplying the chlorosilane-based gas and the hydrogen nitride-based gas. At this time, the fourth gas supplier 340 is controlled to continuously supply the $N_2$ gas as the inert gas to the transfer chamber 203.

As the cyclic process which is a specific example of a film-processing method, the following method may be considered. For example, there may be a case where a HCDS gas is used as the chlorosilane-based gas and a $NH_3$ gas is used as the hydrogen nitride-based gas. In that case, the HCDS gas is supplied to the wafer 100 in a first step, and the $NH_3$ gas is supplied to the wafer 100 in a second step. Between the first step and the second step, a purging step is performed. In the purging step, the third gas supplier 330 is controlled to supply the $N_2$ gas, and the atmosphere in the process chamber 201 is exhausted. A SiN film is formed on the wafer 100 by performing a cyclic process, which includes performing the first step, the purging step, and the second step a plurality of times.

(Substrate Loading/Unloading Step)

After a predetermined process is performed on the wafer 100, the processed wafer 100 is unloaded from the inside of the process container 202 in a substrate loading/unloading step. The processed wafer 100 is unloaded by operating the arm 222 and the robot arm 255 in the reverse manner to the operation when loading the wafer 100.

At this time, in a case where the unprocessed wafer 100 is held by the robot arm 255, the robot arm 255 loads the unprocessed wafer 100 into the process container 202. Then, the substrate processing step is performed on the wafer 100 in the process container 202. In a case where the unprocessed wafer 100 is not held by the robot arm 255, the unloading of the processed wafer 100 is performed solely.

(Determination Step)

The substrate processing step and the substrate loading/unloading step are performed one or more times until the unprocessed wafer 100 does not exist. Then, when the unprocessed wafer 100 does not exist, the series of processes described above are completed.

(3) Operation of Substrate Mounting Table, Operation of Shield Plate, and Gas Flow in Substrate Processing Process As described above, the operation of the substrate mounting table 210 is performed by the substrate mounting table elevating part 218, and the operation of the shield plate 250 is performed by the shield plate elevating part 258.

In the substrate loading step, after the wafer 100 is placed on the substrate mounting surface 211, the substrate mounting table 210 is raised to be located at the wafer processing position. The shield plate 250 is also raised in the same manner as the substrate mounting table 210.

Figure 9A:
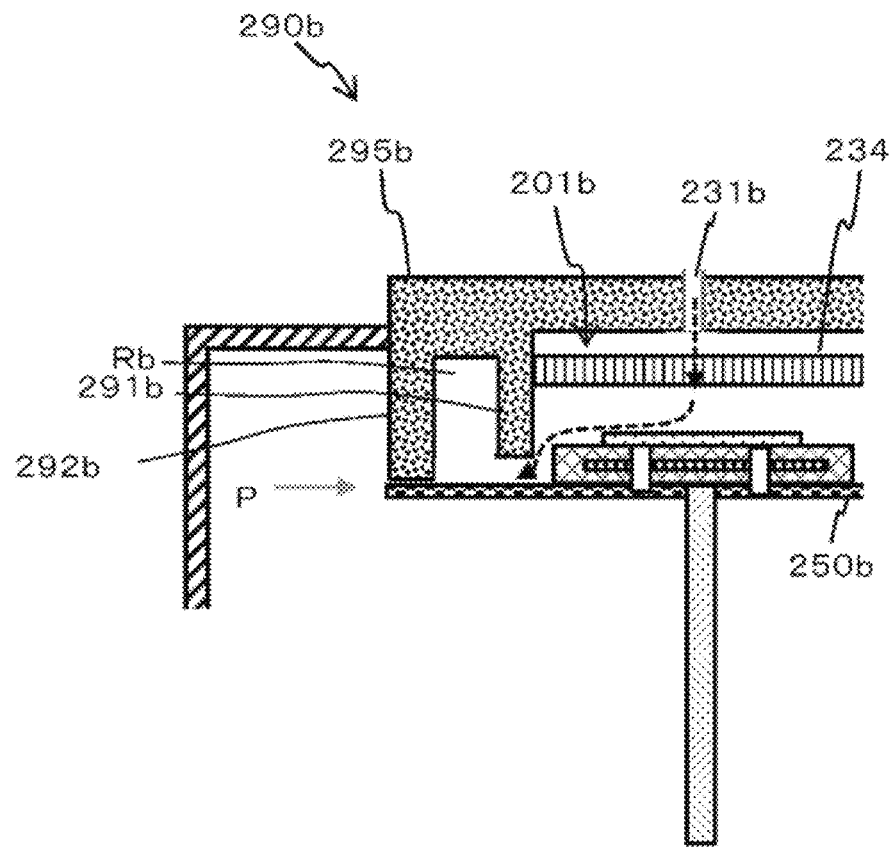
FIG. 9A is a diagram showing a flow of a gas flowing out from a process chamber to an exhaust flow path and a flow of a gas flowing out from the transfer chamber to the exhaust flow path.
Figure 9B:
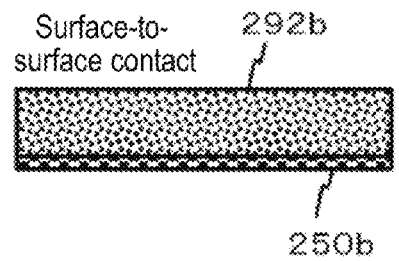
FIG. 9B is a diagram showing a state in which a shield plate and a second wall are in surface-to-surface contact with each other.

By ascending operations of the substrate mounting table 210 and the shield plate 250, the shield plate 250 is located at the position where the shield plate 250 comes into contact with the lower end of the second wall 292 over the entire circumference (see FIG. 9B). A predetermined gap is uniformly formed over the entire circumference between the shield plate 250 and the lower end of the first wall 291. Further, the lower end side of the first wall 291 and the lower end side of the second wall 292 are arranged to surround the outer periphery of the substrate mounting table 210, and the lower end of the first wall 291 is arranged to be located below the substrate mounting surface 211.

After the ascending operations of the substrate mounting table 210 and the shield plate 250 are completed, a predetermined gas is supplied into the process chamber 201 via the gas introduction hole 231. An inert gas is supplied into the transfer chamber 203 via the gas introduction hole 345.

The excess gas supplied into the process chamber 201 is discharged to the exhaust flow path R via the gap formed between the shield plate 250 and the lower end of the first wall 291 (see FIG. 9A). Since the gap is uniformly formed over the entire circumference between the shield plate 250 and the lower end of the first wall 291, the gas in the process chamber 201 may be uniformly discharged to the exhaust flow path R.

The gas discharged to the exhaust flow path R is discharged to the outside of the process container 202 via the exhaust hole 271. Since the exhaust flow path R is formed over the entire circumference between the first wall 291 and the second wall 292, the exhaust flow path R may function as an exhaust buffer (gas holder). Therefore, even when the gas in the exhaust flow path R is discharged from the exhaust hole 271, the exhaust of the gas from the process chamber 201 into the exhaust flow path R may be made uniform.

The lower end side of the first wall 291 and the lower end side of the second wall 292 are configured to surround the outer periphery of the substrate mounting table 210. The lower end of the first wall 291 is located below the substrate mounting surface 211. According to this configuration, the gas flow path formed between the process chamber 201 and the exhaust flow path R extends around like a labyrinth, such that it is difficult for the gas to pass through the gas flow path. Therefore, the gas supplied into the process chamber 201 may be filled in the process chamber 201. As a result, the internal pressure of the process chamber 201 may be maintained at a predetermined high level. Further, the gas discharged to the exhaust flow path R is discharged to the outside of the process container 202 via the exhaust hole 271. Therefore, the internal pressure of the exhaust flow path R may be maintained at a predetermined low level. Since the internal pressure of the process chamber 201 is set to be higher than the internal pressure of the exhaust flow path R as described above, it is possible to prevent the gas discharged to the exhaust flow path R from flowing back into the process chamber 201.

As described above, the shield plate 250 is arranged at the position where the shield plate 250 comes into contact with the lower end of the second wall 292 over the entire circumference, and the predetermined gap is uniformly formed between the shield plate 250 and the lower end of the first wall 291 over the entire circumference. According to this configuration, it is possible to prevent the gas discharged to the exhaust flow path R from being discharged to the transfer chamber 203 while discharging the gas in the process chamber 201 to the exhaust flow path R. Further, it is possible to prevent the inert gas in the transfer chamber 203 from flowing into the exhaust flow path R.

Further, the supply of the inert gas into the transfer chamber 203 is continuously performed while supplying the predetermined gas into the process chamber 201. At this time, the first gas supplier 310, the second gas supplier 320, the third gas supplier 330, the fourth gas supplier 340, the first exhauster 270, and the second exhauster 260 are controlled such that the internal pressure of the transfer chamber 203 becomes higher than the internal pressure of the exhaust flow path R. By making the internal pressure of the transfer chamber 203 higher than the internal pressure of the exhaust flow path R, the shield plate 250 may be bent to be kept in close contact with the lower end of the second wall 292. As a result, the exhaust flow path R and the transfer chamber 203 may be reliably disconnected to prevent an inflow and an outflow of the gas between the exhaust flow path R and the transfer chamber 203.

Even when the inert gas in the transfer chamber 203 flows into the exhaust flow path R due to pressure fluctuation during the substrate processing process, the gas flow path formed between the process chamber 201 and the exhaust flow path R extends around like a labyrinth. According to this configuration, it is difficult for the gas to pass through the gas flow path, whereby it is possible to prevent the inert gas from flowing into the process chamber 201. Further, since the internal pressure of the exhaust flow path R is maintained at a predetermined low level, the inert gas may be discharged from the exhaust flow path R to the outside of the process container 202 without allowing the inert gas to flow into the process chamber 201.

The substrate mounting table elevating part 218 and the shield plate elevating part 258 are respectively configured to be capable of moving up or down independently. The shield plate 250 may be operated solely while maintaining the height of the substrate mounting table 210. Further, the substrate mounting table 210 may be operated solely while maintaining the height of the shield plate 250. For example, the shield plate 250 may be operated solely to adjust the distance (clearance) between the shield plate 250 and the first wall 291 and the clearance between the shield plate 250 and the second wall 292, thereby regulating the exhaust characteristics. Further, the substrate mounting table 210 may be operated solely to adjust the clearance between the substrate mounting table 210 and the gas introduction hole 231, thereby regulating gas supply characteristics.

(5) Effect of the Embodiments

According to the embodiments of the present disclosure, one or more of the following effects may be obtained.

(a) In the embodiments of the present disclosure, the first wall 291 and the second wall 292 are arranged on the outer peripheral side of the substrate mounting table 210, and the shield plate 250 is arranged below the substrate mounting table 210 to extend to the lower side of the lower end of the second wall 292. According to this configuration, since the process chamber 201 and the transfer chamber 203 are partitioned, it is possible to suppress the inflow of the gas in the process chamber 201 into the transfer chamber 203 and the inflow of the gas in the transfer chamber 203 into the process chamber 201 during the substrate processing process.

In the embodiments of the present disclosure, the exhaust flow path R is formed between the first wall 291 and the second wall 292. According to this configuration, the excess gas supplied into the process chamber 201 may be discharged to the outside of the process chamber 201. Further, even in a case where the gas in the transfer chamber 203 flows into the exhaust flow path R, the gas may be discharged to the outside of the process container 202 via the exhaust flow path R.

(b) In the embodiments of the present disclosure, the distance between the shield plate 250 and the lower end of the first wall 291 is larger than the distance between the shield plate 250 and the lower end of the second wall 292. That is, the lower end of the second wall 292 is configured to be closer to the shield plate 250 than the lower end of the first wall 291. According to this configuration, it is possible to suppress the gas discharged to the exhaust flow path R from being discharged to the transfer chamber 203 while discharging the gas in the process chamber 201 to the exhaust flow path R. Further, it is possible to prevent the inert gas in the transfer chamber 203 from flowing into the exhaust flow path R. More specifically, the gas may be predominantly discharged from the process chamber 201 to the exhaust flow path R.

(c) In the embodiments of the present disclosure, during the substrate processing step, the lower end side of the first wall 291 and the lower end side of the second wall 292 are configured to surround the outer periphery of the substrate mounting table 210, and the lower end of the first wall 291 is configured to be located below the substrate mounting surface 211. According to this configuration, the gas flow path formed between the process chamber 201 and the exhaust flow path R extends around like a labyrinth such that it is difficult for the gas to pass through the gas flow path. Therefore, the predetermined gas supplied to the process chamber 201 may be thoroughly filled in the process chamber 201 and then discharged to the exhaust flow path R. Further, even when the inert gas in the transfer chamber 203 flows into the exhaust flow path R, it is possible to prevent the inert gas from flowing into the process chamber 201.

(d) In the embodiments of the present disclosure, the lower end side of the first wall 291 and the lower end side of the second wall 292 are configured to surround the outer periphery of the substrate mounting table 210, and the lower end of the first wall 291 is located below the substrate mounting surface 211. According to this configuration, the gas flow path formed between the process chamber 201 and the exhaust flow path R extends around like a labyrinth, such that it is difficult for the gas to pass through the gas flow path. Therefore, the gas supplied into the process chamber 201 may be filled in the process chamber 201. As a result, the pressure in the process chamber 201 may be kept at a predetermined high level. Further, since the gas discharged to the exhaust flow path R is discharged to the outside of the process container 202 via the exhaust hole 271, the internal pressure of the exhaust flow path R may be maintained at a predetermined low level. Since the internal pressure of the process chamber 201 is set to be higher than the internal pressure of the exhaust flow path R as described above, it is possible to prevent the gas discharged to the exhaust flow path R from flowing back into the process chamber 201.

(e) In the embodiments of the present disclosure, during the substrate processing step, the lower end of the second wall 292 is configured to make contact with the shield plate 250 over the entire circumference. According to this configuration, it is possible to prevent the gas discharged to the exhaust flow path R from being discharged to the transfer chamber 203. In addition, it is possible to reliably prevent the inert gas in the transfer chamber 203 from flowing into the exhaust flow path R. As a result, an exhaust function of the exhaust flow path R may be enhanced.

(f) In the embodiments of the present disclosure, the internal pressure of the transfer chamber 203 during the substrate processing step is controlled to be higher than the internal pressure of the exhaust flow path R. Since a close contact between the second wall 292 and the shield plate 250 may be maintained by a pressure difference, the exhaust flow path Rb and the transfer chamber 203b may be disconnected from each other, thereby reliably suppressing the inflow of the gas in the process chamber 201 into the transfer chamber 203 and the inflow of the gas in the transfer chamber 203 into the process chamber 201.

(g) In the embodiments of the present disclosure, even when the inert gas in the transfer chamber 203 flows into the exhaust flow path R due to the pressure fluctuation during the substrate processing process, the gas flow path formed between the process chamber 201 and the exhaust flow path R extends around like a labyrinth. According to this configuration, since it becomes difficult for the gas to pass through the gas flow path, it is possible to prevent the inert gas from flowing into the process chamber 201. Further, since the internal pressure of the exhaust flow path R is maintained at a predetermined low level, the inert gas may be discharged from the exhaust flow path R to the outside of the process container 202 without allowing the inert gas to flow into the process chamber 201.

(h) In the embodiments of the present disclosure, the substrate mounting table elevating part 218 and the shield plate elevating part 258 are respectively configured to be capable of moving up or down independently. Since the shield plate 250 may be independently raised or lowered in this way, the clearance between the shield plate 250 and the first wall 291 and the clearance between the shield plate 250 and the second wall 292 may be adjusted while maintaining the height of the substrate mounting table 210, whereby it possible to regulate the exhaust characteristics. Further, since the substrate mounting table 210 may be independently raised or lowered, the clearance between the substrate mounting table 210 and the gas introduction hole 231 may be adjusted while maintaining the height of the shield plate 250, whereby it possible to regulate the gas supply characteristics to the wafer 100.

(i) In the process container 202 of the embodiments of the present disclosure, the substrate mounting tables 210a to 210d, the first gas supplier 310, the second gas supplier 320, the third gas supplier 330, and the exhaust flow paths Ra to Rd are installed respectively. Thus, it is possible to independently process each of a plurality of wafers 100 in the process container 202.

(j) The first exhauster 270 configured to discharge the gas in the exhaust flow paths Ra to Rd is installed at the second walls 292a to 292d in the embodiments of the present disclosure. The common exhaust pipe 272 of the first exhauster 270 is arranged at a position where the distances from the exhaust holes 271a to 271d in the first exhaust pipes 273a to 273d are equal to each other. The common exhaust pipe 272 is configured such that the exhaust conductances of the exhaust flow paths Ra to Rd are equal to each other. According to this configuration, the exhaust conductances of the process chambers 201a to 201d may be kept constant. As a result, it is possible to enhance the uniformity of substrate processing in the process chambers 201a to 201d.

Other Embodiments of the Present Disclosure

Although the embodiments of the present disclosure are specifically described above, the present disclosure is not limited to the above-described embodiments, and various changes may be made without departing from the spirit thereof.

Figure 9C:
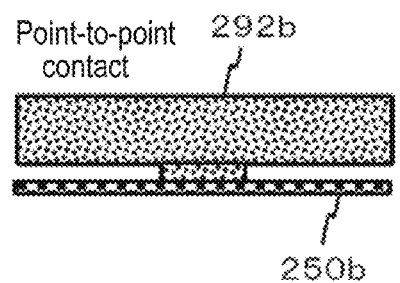
FIG. 9C is a diagram showing a state in which a shield plate and a second wall are in point-to-point contact with each other.

In the above-described embodiments of the present disclosure, the examples in which the shield plate 250 is arranged to make contact with the lower end of the second wall 292 over the entire circumference (see FIG. 9B) are describe above. However, the present disclosure is not limited thereto. For example, the lower end of the second wall 292 may be configured to partially make contact with the shield plate 250 (see FIG. 9C). FIGS. 9B and 9C show a positional relationship between the shield plate 250 and the second wall 292 when viewed in the solid arrow direction from the position indicated by "P" in FIG. 9A. From the viewpoint of suppressing the inflow and outflow of the gas between the exhaust flow path R and the transfer chamber 203, the shield plate 250 and the second wall 292 may be arranged to make contact with each other over the entire circumference. Even in this case, the distance between the shield plate 250 and the second wall 292 may be kept constant, and at least some of the effects mentioned in the above-described embodiments may be obtained. In particular, this configuration is effective when a shape of the lower end of the second wall 292 and a shape of an upper surface side of the shield plate 250 do not match and cannot make contact with each other over the entire circumference.

When the lower end of the second wall 292 is configured to partially make contact with the shield plate 250, points where the lower end of the second wall 292 and the shield plate 250 make contact with each other are provided at predetermined intervals in the circumferential direction of the shield plate 250. By doing so, the conductance in the circumferential direction between the process chamber 201 and the transfer chamber 203 may be kept constant. The exhaust characteristics of the gas discharged from the process chamber 201 may be kept constant in the circumferential direction. As a result, it is possible to improve the processing uniformity of the wafer 100.

Figure 9D:
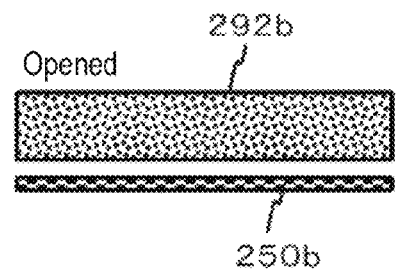
FIG. 9D is a diagram showing a state in which a shield plate and a second wall are opened.

Further, for example, the lower end of the second wall 292 and the shield plate 250 may be configured to be opened (see FIG. 9D). FIG. 9D shows a positional relationship between the shield plate 250 and the second wall 292 when viewed in the solid arrow direction from the position indicated by "P" in FIG. 9A. From the viewpoint of suppressing the inflow and outflow of the gas between the exhaust flow path R and the transfer chamber 203, the shield plate 250 and the second wall 292 may be arranged to make contact with each other over the entire circumference. Even in this case, at least some of the effects mentioned in the above-described embodiments may be obtained.

As described above, the substrate mounting table elevating part 218 and the shield plate elevating part 258 of the present disclosure are configured to be capable of moving up or down independently. Therefore, for example, even in a case where the shield plate 250 and the lower end of the second wall 292 are arranged to make contact with each other over the entire circumference at the start of the substrate processing process, for example, when the pressure difference between the transfer chamber 203 and the exhaust flow path R may have to be regulated during the substrate processing process, the shield plate 250 may be lowered, while maintaining the position of the substrate mounting table 210, such that the lower end of the second wall 292 and the shield plate 250 are opened. As described above, in the present disclosure, while maintaining the position of the substrate mounting table 210, the shield plate 250 and the lower end of the second wall 292 are brought into contact with each other or opened depending on the situation during the substrate processing process.

In the above-described embodiments, the examples in which the common exhaust pipe 272 is configured to penetrate the bottom of the process container 202 on the lower side are described above. However, the present disclosure is not limited thereto. For example, the common exhaust pipe 272 may be configured to penetrate an upper portion of the process container 202 on an upper side (see FIG. 10). Also in this case, the same effects as those mentioned in the above-described embodiments may be obtained.

In the above-described embodiments, a material of the shield plate 250 has not been described. The material of the shield plate 250 may be capable of being bent by the pressure difference between the exhaust flow path R and the transfer chamber 203. In this case, the lower end of the second wall 292 and the shield plate 250 may be more reliably brought into close contact with each other.

In the above-described embodiments, the examples in which the lower end of the first wall 291 is arranged to be located below the substrate mounting surface 211. However, the present disclosure is not limited thereto. For example, the lower end of the first wall 291 may be arranged to be substantially flush with the substrate mounting surface 211, or may be arranged to be located above the substrate mounting surface 211. Even in these cases, at least some of the effects mentioned in the above-described embodiments may be obtained.

Further, for example, in the above-described embodiments, the examples in which the SiN film is formed on the wafer 100 are described above. However, the present disclosure is not limited thereto. For example, the present disclosure may be suitably applied to a case where a silicon film (Si film), a silicon oxide film (SiO film), a silicon oxynitride film (SiON film) or the like is formed on the wafer 100. Further, the present disclosure may be suitably applied to a case where a metal-based thin film such as a titanium film (Ti film), a titanium oxide film (TIO film), a titanium nitride film (TiN film), an aluminum film (Al film), an aluminum oxide film (AlO film), a hafnium oxide film (HfO) or the like is formed on the wafer 100. In these cases as well, the same effects as those mentioned in the above-described embodiments may be obtained.

The present disclosure is not limited to the process of forming the film on each of the plurality of wafers 100, but may be suitably applied to a case of performing an etching process, an annealing process, a plasma-modifying process on each of the plurality of wafers 100, and the like. In these cases as well, the same effects as those mentioned in the above-described embodiments may be obtained.

According to the embodiments of the present disclosure, it is possible to suppress a gas in a process chamber from flowing into the transfer chamber and suppress a gas in the transfer chamber from flowing into the process chamber in a substrate processing process.

While certain embodiments are described above, these embodiments are presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   at least one substrate mounting table including a substrate mounting surface on which a substrate is mounted;
   a process container configured to accommodate the at least one substrate mounting table and form a process chamber configured to process the substrate mounted on the substrate mounting surface;
   at least one gas supplier configured to supply a processing gas to the process chamber;
   a first wall arranged on an outer peripheral side of the at least one substrate mounting table;
   a second wall arranged at an outer side of the first wall on the outer peripheral side of the at least one substrate mounting table;
   at least one exhaust flow path formed between the first wall and the second wall and configured to discharge a gas in the process chamber; and a shield plate arranged below the at least one substrate mounting table and configured to extend at least to a lower side of a lower end of the second wall, wherein the lower end of the second wall is configured to be closer to the shield plate than a lower end of the first wall, and wherein the lower end of the second wall is configured to make contact with the shield plate.

2. The substrate processing apparatus of claim 1, wherein a distance between the shield plate and the lower end of the first wall is longer than a distance between the shield plate and the lower end of the second wall.

3. The substrate processing apparatus of claim 2, wherein the lower end of the second wall is configured to make contact with the shield plate.

4. The substrate processing apparatus of claim 1, wherein a lower end side of the first wall and the lower end side of the second wall are configured to surround an outer periphery of the at least one substrate mounting table.

5. The substrate processing apparatus of claim 1, wherein the at least one substrate mounting table and the shield plate are configured to be capable of moving up or down.

6. The substrate processing apparatus of claim 1, wherein a part of the lower end of the second wall is configured to make contact with the shield plate.

7. The substrate processing apparatus of claim 6, wherein points where the lower end of the second wall and the shield plate make contact with each other are provided at predetermined intervals in a circumferential direction of the shield plate.

8. The substrate processing apparatus of claim 1, wherein the at least one substrate mounting table includes a plurality of substrate mounting tables, the at least one gas supplier includes a plurality of gas suppliers, and the at least one exhaust flow path includes a plurality of exhaust flow paths in the process container.

9. The substrate processing apparatus of claim 8, wherein a plurality of first exhausters configured to discharge gases in the plurality of exhaust flow paths to an outside of the process container are respectively installed at the second wall, and wherein the plurality of first exhausters are respectively configured such that exhaust conductances of the plurality of exhaust flow paths are equal to each other.

10. The substrate processing apparatus of claim 9, further comprising:

a first inert gas supplier configured to supply an inert gas into the process chamber;

a transfer chamber adjacent to the process chamber;

a second inert gas supplier configured to supply the inert gas into the transfer chamber;

a second exhauster configured to discharge the inert gas in the transfer chamber; and a controller configured to be capable of controlling at least one selected from the group of the first exhausters, the second exhauster, the first inert gas supplier, and the second inert gas supplier such that an internal pressure of the transfer chamber is higher than internal pressures of the exhaust flow paths.

11. A method of manufacturing a semiconductor device, comprising:

(a) mounting a substrate on at least one substrate mounting table including a substrate mounting surface;

(b) supplying a processing gas from at least one gas supplier to a process chamber configured to accommodate the at least one substrate mounting table installed in a process container; and (c) discharging a gas in the process chamber, wherein in (c), the gas is discharged to at least one exhaust flow path formed between a first wall arranged on an outer peripheral side of the at least one substrate mounting table and a second wall arranged at an outer side of the first wall on the outer peripheral side of the at least one substrate mounting table, and at this time, the discharge of the gas to the at least one exhaust flow path is performed by using a space among the first wall, the second wall, and a shield plate arranged below the at least one substrate mounting table and configured to extend at least to a lower side of a lower end of the second wall, and wherein the lower end of the second wall is configured to be closer to the shield plate than a lower end of the first wall, and wherein the lower end of the second wall is configured to make contact with the shield plate.

12. A non-transitory computer-readable recording medium storing a program that causes, by a computer, a substrate processing apparatus to perform a process comprising:

(a) mounting a substrate on at least one substrate mounting table including a substrate mounting surface;

(b) supplying a processing gas from at least one gas supplier to a process chamber formed in a process container and configured to accommodate the at least one substrate mounting table; and (c) discharging a gas in the process chamber, wherein in (c), the gas is discharged to at least one exhaust flow path formed between a first wall arranged on an outer peripheral side of the at least one substrate mounting table and a second wall arranged at an outer side of the first wall on the outer peripheral side of the at least one substrate mounting table, and at this time, the discharge of the gas to the at least one exhaust flow path is performed by using a space among the first wall, the second wall, and a shield plate arranged below the at least one substrate mounting table and configured to extend at least to a lower side of a lower end of the second wall, and wherein the lower end of the second wall is configured to be closer to the shield plate than a lower end of the first wall, and wherein the lower end of the second wall is configured to make contact with the shield plate.

* * * * *